(12) United States Patent
Delperier et al.

(10) Patent No.: US 6,942,893 B2
(45) Date of Patent: Sep. 13, 2005

(54) DENSIFYING HOLLOW POROUS SUBSTRATES BY CHEMICAL VAPOR INFILTRATION

(75) Inventors: Bernard Delperier, Martignas sur Jalles (FR); Jean-Luc Domblides, Bruges (FR); Jean-Philippe Richard, Le Taillan Medoc (FR); Pierre Delaurens, Pessac (FR)

(73) Assignee: SNECMA Moteurs, Paris (FR)

( * ) Notice: Subject to any disclaimer, the term of this patent is extended or adjusted under 35 U.S.C. 154(b) by 248 days.

(21) Appl. No.: 10/024,272

(22) Filed: Dec. 18, 2001

(65) Prior Publication Data

US 2002/0076491 A1 Jun. 20, 2002

(30) Foreign Application Priority Data

Dec. 19, 2000 (FR) .............................. 00 16615

(51) Int. Cl.[7] ....................... C23C 16/455; C23C 16/458
(52) U.S. Cl. ................. 427/237; 427/248.1; 427/249.2; 427/255.12; 427/900; 118/719; 118/720
(58) Field of Search ................................ 427/230, 237, 427/249.2, 249.3, 249.4, 248.1, 255.12, 900; 118/715, 719, 728, 720

(56) References Cited

U.S. PATENT DOCUMENTS

| | | | |
|---|---|---|---|
| 4,194,028 A | * | 3/1980 | Sirtl et al. .............. 427/249.16 |
| 4,609,562 A | | 9/1986 | Isenberg et al. |
| 4,741,925 A | * | 5/1988 | Chaudhuri et al. ......... 427/231 |
| 5,904,957 A | * | 5/1999 | Christin et al. .......... 427/248.1 |
| 5,911,824 A | * | 6/1999 | Hammond et al. ........... 117/81 |
| 6,669,988 B2 | * | 12/2003 | Daws et al. ............. 427/249.2 |
| 6,783,621 B1 | * | 8/2004 | Georges et al. ............. 156/173 |
| 6,837,952 B1 | * | 1/2005 | Guirman et al. ............ 156/148 |

FOREIGN PATENT DOCUMENTS

| | | | |
|---|---|---|---|
| FR | 2 801 304 A | | 5/2001 |
| JP | 07 082058 A | | 3/1995 |
| JP | 2000-247779 A | * | 9/2000 |

* cited by examiner

Primary Examiner—Timothy Meeks
Assistant Examiner—Wesley D. Markham
(74) Attorney, Agent, or Firm—Weingarten, Schurgin, Gagnebin & Lebovici, LLP

(57) ABSTRACT

A porous substrate having a concave inside face and an outside face is disposed in an enclosure, and reactive gas is introduced into the enclosure to densify the substrate. At least a portion of the gas is divided into two non-zero fractions. The first fraction of the gas is fed to the inside face of the substrate. The second fraction of the gas is fed to only the outside face of the substrate. Alternatively, the first fraction of the gas is fed via a tooling extending into an inside volume defined by the concave inside face of the substrate.

18 Claims, 9 Drawing Sheets

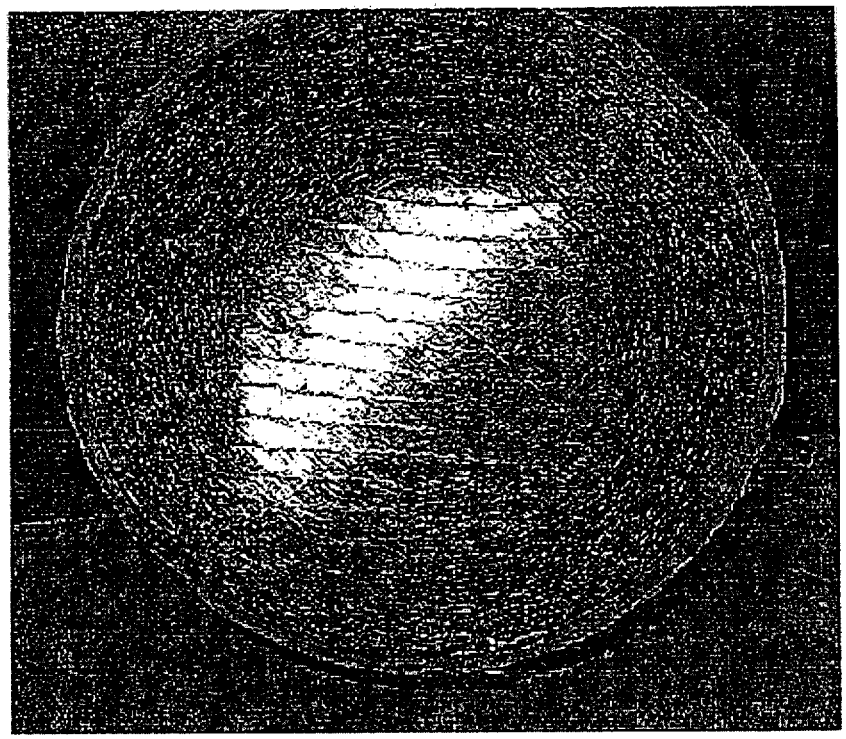
FIG.9
FIG.10
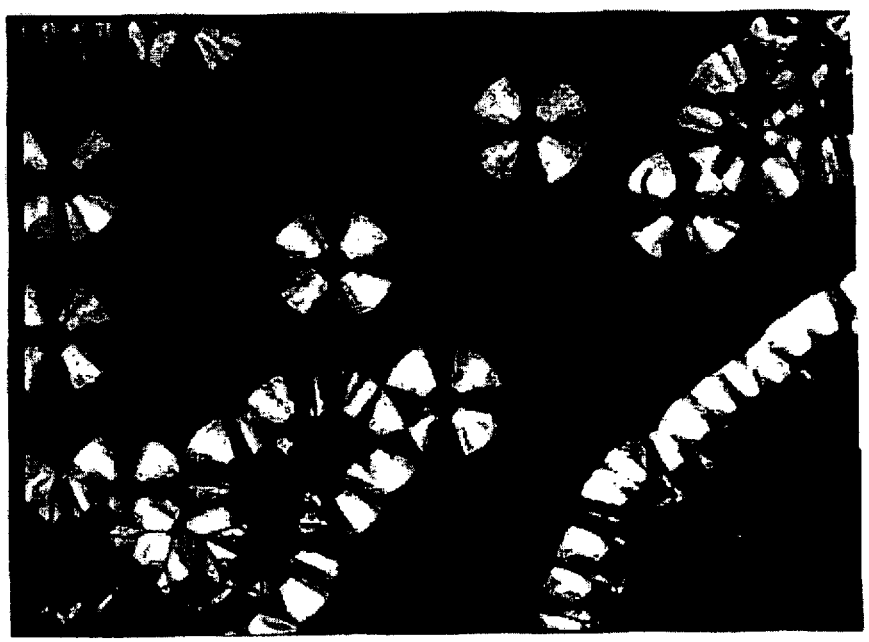
CORE ×440

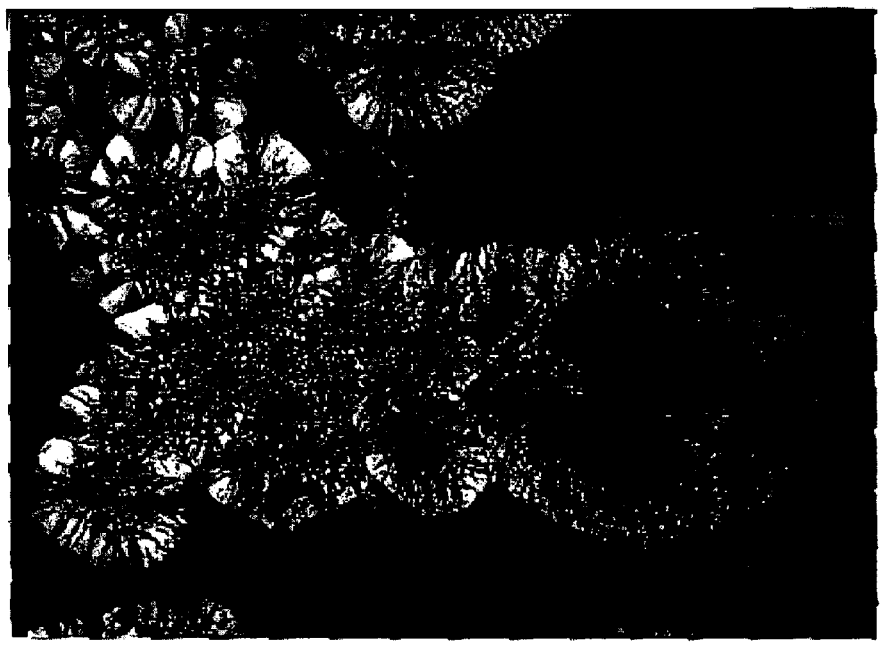
FIG. 12
(PRIOR ART)
FIG. 13
(PRIOR ART)

DENSIFYING HOLLOW POROUS SUBSTRATES BY CHEMICAL VAPOR INFILTRATION

BACKGROUND OF THE INVENTION

The invention relates to densifying hollow porous substrates by chemical vapor infiltration (CVI), and more particularly doing so at pressure equilibrium, i.e. without any pressure gradient between the faces of the substrates.

A particular field of application for the invention is making hollow parts out of a composite material comprising a porous substrate densified by a matrix, and in particular hollow parts made out of a thermostructural composite material.

The term "hollow porous substrate" is used herein to mean a substrate of hollow shape having a concave inside surface that is continuous, i.e. that does not have any holes, other than those due to the porous nature of the substrate. Examples of hollow shapes are spherical cap shapes, cylindrical or cylindro-conical shapes that are closed at one end, receptacle or bowl shapes, and cover shapes, not necessarily axially symmetrical. Examples of hollow parts obtained by densifying such substrates are receptacles for the chemical and metallurgical industries, such as crucibles or crucible-support bowls, or protective bodies for spacecraft, such as nosecones that form heat shields.

The term "thermostructural composite material" is used herein to mean a composite material which presents both good mechanical properties enabling it to constitute structural elements, and the ability to conserve these properties at high temperatures. Examples of thermostructural composite materials are carbon/carbon (C/C) composite materials comprising a porous substrate of carbon fibers densified by a carbon matrix, and ceramic matrix composite (CMC) materials comprising a refractory porous substrate, e.g. of carbon or ceramic fibers, densified by a ceramic matrix.

Densifying porous substrates by chemical vapor infiltration at pressure equilibrium is a well-known process. The substrates to be densified are placed in an enclosure and a reactive gas is admitted into the enclosure where the temperature and pressure conditions are controlled in such a manner that the gas diffuses into the pores of the substrates and forms therein a solid deposit that constitutes the matrix of the composite material either by causing a precursor gas to decompose or by causing a reaction to take place between a plurality of precursor gases contained in the gas. This applies, for example, to a carbon matrix where the gaseous precursor is generally an alkane, an alkyl, or an alkene, such as propane or methane or a mixture thereof. For a ceramic matrix made of silicon carbide, for example, the gaseous precursor is methyltrichlorosilane.

In general, the reactive gas is admitted into one end of the enclosure, while the effluent gas comprising the residue of the admitted gas and any reaction products is extracted from the other end. Admission advantageously takes place through a preheater zone serving to bring the admitted gas up to a temperature close to the temperature of the substrates for densifying.

A plurality of substrates can be densified simultaneously in a single enclosure, with the substrates being placed in such a manner as to ensure that all of them are exposed to the flow of reactive gas admitted into the enclosure. U.S. Pat. Ser. No. 5,904,957 shows identical substrates disposed in a particular manner in annular stacks for this purpose. The gas is admitted and directed towards the inside (or the outside) of the stacks and it flows through the substrates and the gaps between them so as to be taken up from the outside (or the inside) of the stacks.

When the substrates to be densified are hollow as defined above, having relatively deep concave portions, and in particular when they are of quite large dimensions, defects have been observed by the inventors after densification by chemical vapor infiltration. These defects consist in variations in the microstructure of the material of the matrix between different portions of the densified parts, and in the formation of soot or undesirable projections on the substrates.

Since these defects can be attributed to excessive maturation of the admitted gas, i.e. the admitted gas spends too long in transit inside the enclosure and therefore ages, thereby spoiling its properties, attempts have been made to remedy that problem by increasing the gas flow rate by increasing the rate at which effluent gas is pumped out from the enclosure. However that has not made it possible to eliminate the defects completely, while it has considerably increased cost by increasing consumption of reactive gas.

OBJECTS AND SUMMARY OF THE INVENTION

An object of the invention is to provide a method which does not present such drawbacks, i.e. a method that enables hollow-shaped substrates, even when of large dimensions, to be densified in a manner that is relatively uniform and free from defects.

This object is achieved by a method in which, in accordance with the invention, part of the reactive gas flow admitted into the enclosure is guided by tooling to the inside of the volume defined by the concave inside face of the or each hollow-shaped substrate so that said concave inside face is swept in full by a fraction of the total admitted reactive gas flow.

Advantageously, the reactive gas flow admitted into the enclosure is distributed towards each face of the or each substrate disposed inside the enclosure. Preferably, the fraction of the total reactive gas flow traveling over a face of the or each substrate disposed inside the enclosure is not less than 5%, or better still 10%.

The inventors have observed that by guiding a fraction of the gas flow within the enclosure to the insides of the substrates, uniform densification is obtained without unwanted projections or soot being formed, even in the zones situated most deeply inside the hollow shapes. This can be explained by the fact that guiding the flow forces the gas to flow along the internal concave faces of the substrates in full, without forming any pockets of stagnation or any turbulent zones in which excessive maturation of the gas might occur.

A portion of the gas flow can be guided by a wall portion that penetrates part of the way into the volume defined by the concave inside face of the or each substrate, e.g. a cylindrical wall portion which extends to the vicinity of the end wall of the or each substrate.

Advantageously, a plurality of hollow-shaped substrates can be densified simultaneously in the enclosure by being placed in alignment in the general direction along which the gas flows through the enclosure. The gas flow admitted into the enclosure is then distributed appropriately for feeding each of the faces of the substrates by corresponding fractions of the flow.

Another object of the invention is to provide an installation for densification by chemical vapor infiltration and enabling the above-defined method to be implemented, the installation being adapted to densifying hollow-shaped substrates.

This object is achieved by an installation of the type comprising an enclosure having a side wall and first and second end walls opposite each other, means for admitting a reactive gas opening out into the enclosure through the first end wall, means for evacuating effluent gas opening out into the enclosure through the second end wall, and at least one tray for supporting a substrate to be densified, which installation further comprises means for distributing and guiding the gas flow so as to bring a fraction of the admitted gas flow to the location of each substrate within the enclosure and so as to guide a portion of the gas flow brought to said location to the inside of a volume defined by a concave inside face of a substrate disposed at said location.

The flow guide means can comprise a cylindrical wall portion or body presenting a plurality of through passages, the wall portion or body being placed in such a manner as to penetrate at least part of the way into said volume of the substrate.

The means for distributing the flow can comprise one or more trays which extend transversely inside the enclosure and which define flow-distributing passages formed by openings made through the trays and spaces left between the trays and a side wall of the enclosure.

BRIEF DESCRIPTION OF THE DRAWINGS

The invention will be better understood on reading the following description made below by way of non-limiting indication and with reference to the accompanying drawings, in which:

FIG. 9 is a photograph showing the general appearance of the surface of a concave face of a substrate densified using a method in accordance with the invention;

FIG. 10 is a photograph obtained with an optical microscope showing a fraction of the surface of the concave face of the densified substrate shown in FIG. 9;

FIGS. 12 and 13 are photographs obtained with an optical microscope showing the surface state of samples after being densified using the installation of FIG. 11.

DETAILED DESCRIPTION OF EMBODIMENTS OF THE INVENTION

Figure 1:
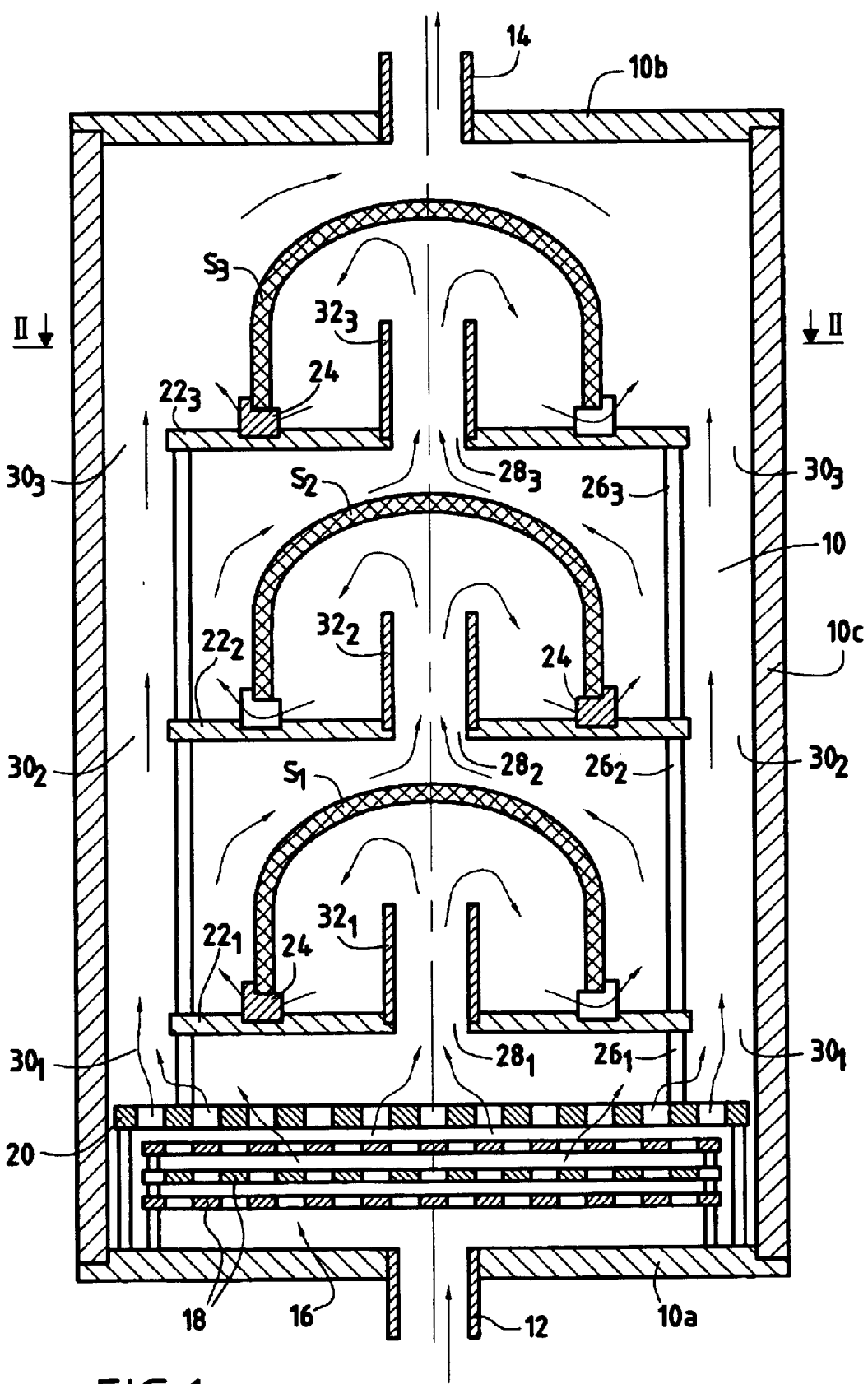
FIG. 1 is a highly diagrammatic fragmentary elevation and section view of a first chemical vapor infiltration installation constituting a first embodiment of the invention.
Figure 2:
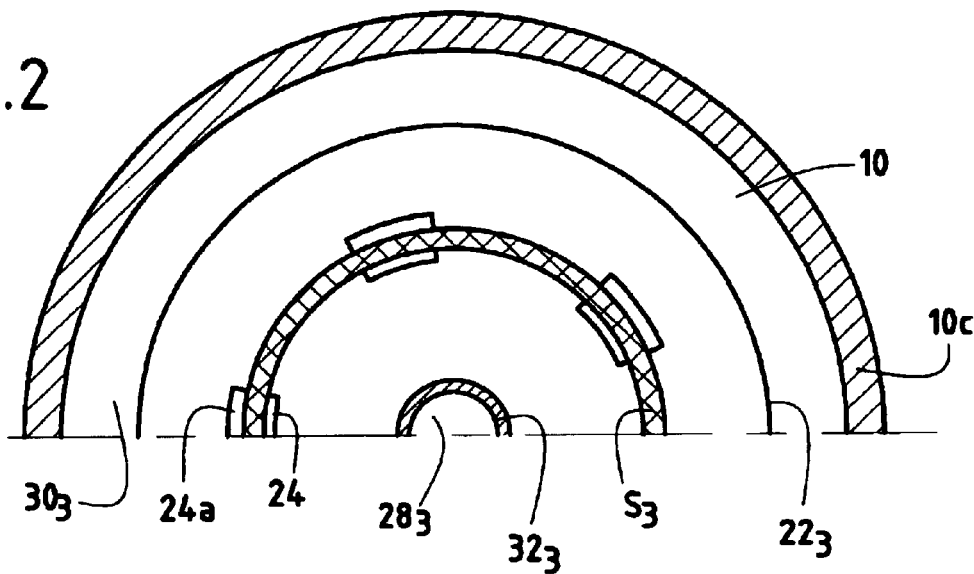
FIG. 2 is a half view in section on plane II—II of FIG. 1 and as seen from above.

FIGS. 1 and 2 are diagrams showing an enclosure 10 constituting a reaction chamber for a chemical vapor infiltration installation.

In the example shown, the enclosure 10 is generally in the form of a vertical axis cylinder. A reactive gas is introduced into the enclosure via a pipe 12 which opens out for example through the center of a bottom wall 10a of the enclosure 10. Effluent gas is extracted from the enclosure via a pipe 14 which opens out through the center of the top wall 10b forming a cover that is remote from the bottom wall 10a. The pipe 14 is connected to pumping apparatus (not shown).

In the bottom portion of the enclosure, the gas passes through a preheater zone 16 constituted, for example, by horizontal perforated plates 18 which are placed one above another. The plates 18 are supported on the bottom 10a of the enclosure by means of legs and spacers.

The preheater zone is separated from the reaction chamber proper by a horizontal diffuser plate 20 which occupies substantially the entire cross-section of the enclosure 10. The diffuser plate 20 is perforated and stands on the bottom 10a of the enclosure via legs.

The above elements of the preheater zone are made of refractory material, e.g. graphite.

The inside of the enclosure is heated by a graphite susceptor which is coupled electromagnetically with an inductor (not shown) situated outside the enclosure. The susceptor forms the side wall 10c of the enclosure 10. The bottom wall 10a and the cover 10b are likewise made of graphite.

An installation as briefly outlined above is of well-known type.

In the example shown in FIG. 1, a plurality of hollow-shaped substrates are disposed inside the enclosure 10 so as to be densified simultaneously, and specifically three such substrates $S_1$, $S_2$, and $S_3$ are disposed therein. The substrates shown are bowl shaped. By way of example they can be preforms for C/C composite material bowls that are to receive crucibles containing liquid silicon in an installation for drawing silicon single crystals using the Czochralski or "CZ" process. Such bowls can have a diameter that is as great as or even greater than 850 millimeters (mm). The substrate or bowl preform is made of carbon fibers, e.g. by winding a filament or by draping fiber plies. Naturally, the invention is not limited to densifying such substrates and it applies to densifying any substrate of hollow shape, such as those defined in the introduction to the present description.

The substrates are placed one above another, in alignment on the generally vertical direction in which the gas flows through the enclosure, and the concave hollow faces of the substrates face downwards.

Each substrate $S_1$, $S_2$, $S_3$ stands on a respective support tray $22_1$, $22_2$, $22_3$ with blocks 24 being interposed between the edges of the substrates and the top faces of the trays. The support tray $22_1$ stands on the diffuser plate 20 via spacers $26_1$, while the trays $22_2$ and $22_3$ stand on the trays $22_1$ and $22_2$ via spacers $26_2$, and $26_3$.

The blocks 24 leave gaps between one another so as to allow the gas to flow. They can be generally be in, the form of circular arcs and their faces can engage in an annular groove formed in the top face of the support plate. Each block 24 can present an annular outer rim 24a on which the rim of the substrate comes to bear via its outside edge. The blocks 24 then act as shapers by preventing the substrates from deforming by expanding. The blocks 24 could also have respective inside rims.

The support trays, the blocks, and the spacers supporting the trays are all made of refractory material, e.g. a refractory metal or graphite.

The support trays $22_1$, $22_2$, and $22_3$ also have the function of distributing the flow of the gas admitted into the enclosure and leaving the preheater zone. For this purpose, the trays are made of gasproof material, and present respective central orifices $28_1$, $28_2$, $28_3$ while also leaving respective annular gaps $30_1$, $30_2$, $30_3$ at their peripheries relative to the side wall 10c of the enclosure.

The orifices $28_1$, $28_2$, $28_3$ and the passages defined by the annular gaps $30_1$, $30_2$, $30_3$ distribute the gas flow so that a fraction of fresh gas admitted into the enclosure reaches each location for a substrate in the enclosure and passes over each face of a substrate disposed at said location. This fraction is at least 5% and preferably at least 10% by volume.

In the example shown, each of the inside and outside faces of the substrates $S_1$, $S_2$, and $S_3$ consequently receives preferably at least 10% and better still about one-sixth of the flow of fresh gas admitted into the enclosure. The passage $30_1$ receives the complement of the total admitted gas flow relative to that which is received by the inside face of the substrate $S_1$ via the orifice $28_1$. The passage $30_2$ receives the portion of the admitted gas flow that has passed through the passage $30_1$, and that is complementary relative to the portion which is received by the outside face of the substrate $S_1$ and the portion which is received by the inside face of the substrate $S_2$ via the orifice $28_2$. The passage $30_3$ receives the portion of the admitted gas flow that has passed through the passage $30_2$, and that is complementary relative to the fraction which is received by the outside face of the substrate $S_2$ and which is received by the inside face of the substrate $S_3$ via the orifice $28_3$. This remaining fraction of the admitted gas flow passing through the passage $30_3$ feeds the outside face of the substrate $S_3$.

Each fraction of the gas flow passing through an orifice $28_1$, $28_2$, or $28_3$ is guided towards the inside face of the end wall of the corresponding substrate by means of a respective guide wall $32_1$, $32_2$, or $32_3$ provided at each location for a substrate inside the enclosure, and constituting gas flow guide tooling for the associated substrate.

Each guide wall is in the form of a cylinder or a length of pipe connected to a respective one of the orifices $28_1$, $28_2$, $28_3$ and it projects above the corresponding support tray inside the volume defined by the substrate. Each guide wall thus brings a fraction of the flow directly into the vicinity of the end wall region of the corresponding substrate. Each guide wall comes to an end at a distance from the inside surface of the corresponding substrate such that an annular gap is left relative thereto which provides a flow section that is at least as great as the flow section provided by the orifice formed through the support tray.

The guide walls are made of a preferably gasproof refractory material, e.g. a refractory metal or graphite, or else a pyrolytic graphite sheet material such as provided under name "SIGRAFLEX®" by the German company SIGRI GmbH.

Because of the guide walls $32_1$, $32_2$, $32_3$, a fraction of the admitted gas flow is forced to sweep over the inside faces of the substrates $S_1$, $S_2$, $S_3$ in full and to flow along said inside faces without leaving any dead volume and without creating any turbulence. It can thus be guaranteed that the transit time of the gas remains at all points below a limit value beyond which the maturation of the gas could become excessive and lead to unwanted deposits forming. As a general rule, the total transit time for the gas through the enclosure, i.e. the time that elapses between the gas being admitted and being removed must be limited. When the matrix is made of carbon, the transit time is generally controlled to remain below 2 seconds (s) and typically lies in the range 1 s to 1.5 s, for example.

The residual portions of the gas flow fractions that have flowed over the inside faces of the substrates are evacuated after passing through the gaps between the blocks 24. All of the effluent gas is collected together in the top portion of the enclosure and is evacuated via the pipe 14.

The chemical vapor infiltration process is of the pressure equilibrium type, i.e. there is no pressure gradient between the inside and outside faces of the substrates.

Although the above description relates to densifying three substrates simultaneously, the number of substrates present in the enclosure could naturally be other than three, for example it could be one, while still maintaining the possibility of organizing the gas flow so that a significant fraction thereof feeds each face of the substrate.

It is also possible to define a plurality of sets of substrates that are placed side by side inside an enclosure, each set comprising one or more substrates in alignment in the general flow direction of the gas. A plurality of admission orifices for the gas into the enclosure, and a plurality of orifices for removing effluent gas from the enclosure, together with a plurality of preheater zones can then be provided, each in register with a corresponding set of substrates and support trays.

In addition, it is possible within a single enclosure to densify other hollow-shaped substrates that are different or different in size from one another, possibly adapting the shapes and dimensions of the means for guiding the flow towards the insides of the substrates. It is also possible for the enclosure to contain other substrates that are not hollow in shape, or that are not so hollow as to require special flow guidance means.

Figure 4:
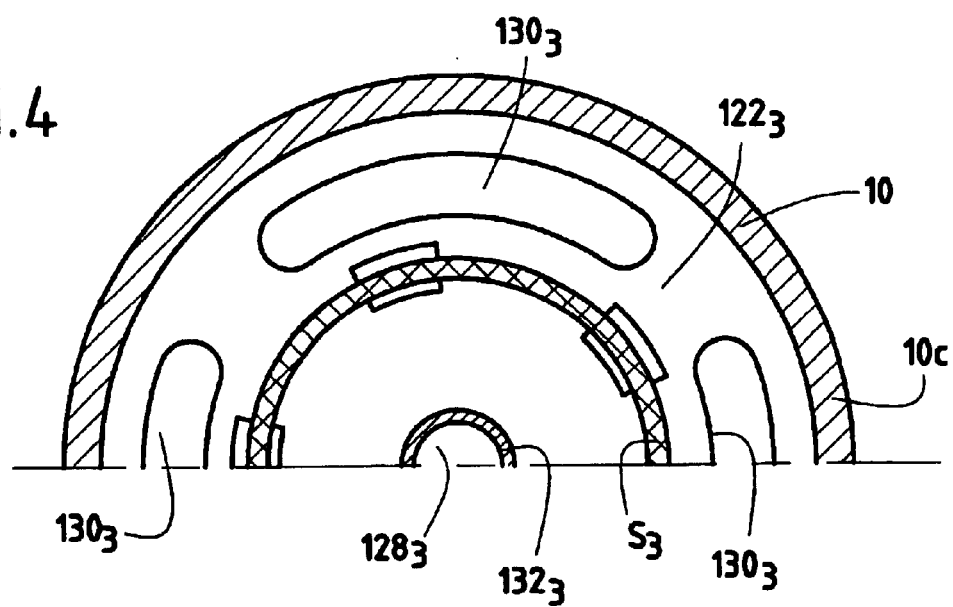
FIG. 4 is a half view in section on plane IV—IV of FIG. 3 and as seen from above.
Figure 3:
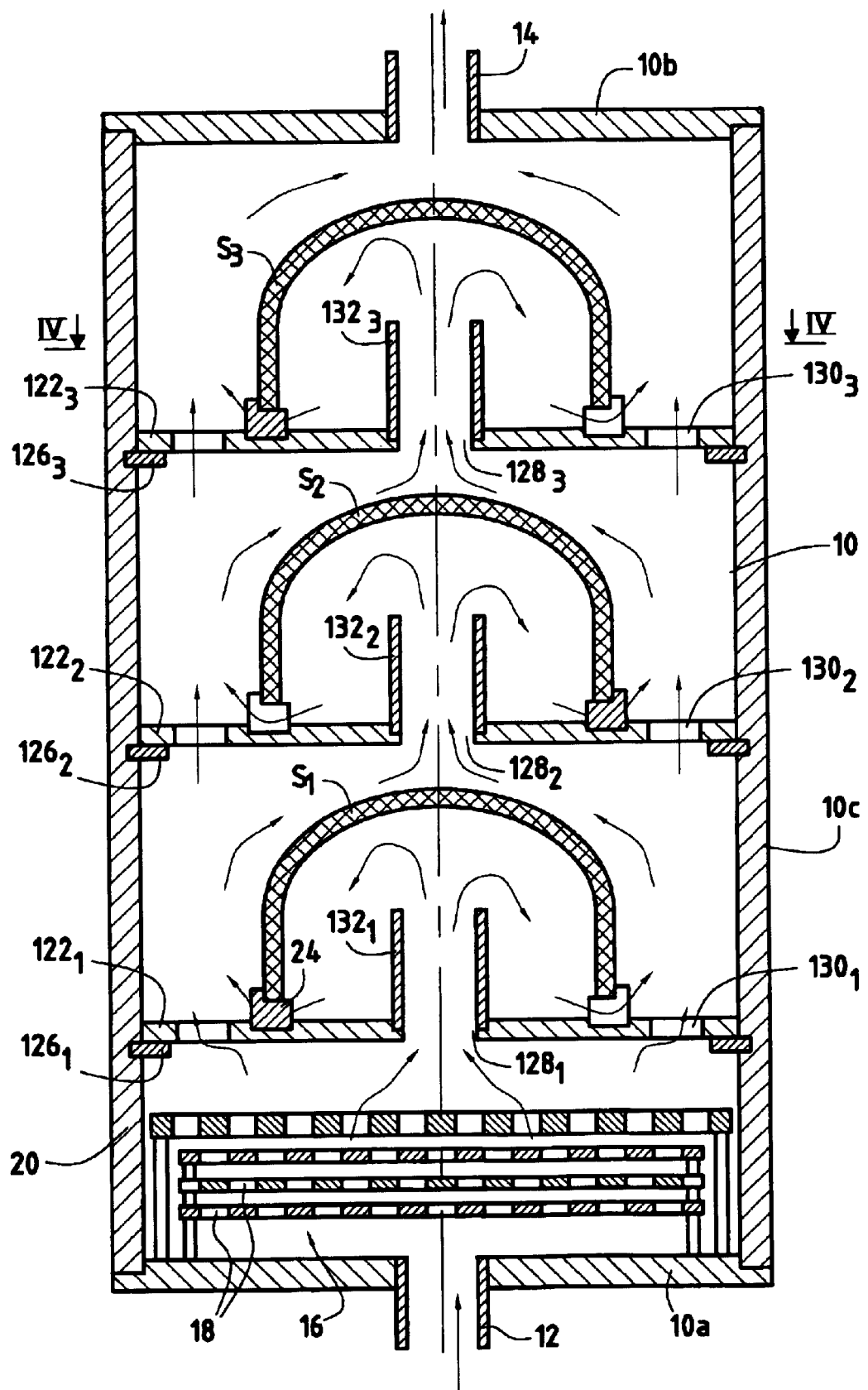
FIG. 3 is a highly diagrammatic fragmentary view in elevation and in section of a chemical vapor infiltration installation constituting a second embodiment of the invention.

FIGS. 3 and 4 show a variant embodiment of the invention. The installation of FIGS. 3 and 4 differs from that of FIGS. 1 and 2 in that the support trays $122_1$, $122_2$, $122_3$ do not stand on spacers, but instead stand on shelf-supports or pegs $126_1$, $126_2$, $126_3$ engaged in the side wall 10c of the enclosure, so that the trays are supported like shelves.

The support trays can then occupy substantially the entire cross-section of the enclosure 10.

As in the embodiment of FIGS. 1 and 2, each support tray has a central orifice $128_1$, $128_2$, $128_3$ having tooling for guiding the flow of reactive gas connected thereto in the form of respective cylindrical walls $132_1$, $132_2$, and $132_3$.

Slots $130_1$, $130_2$, $130_3$ are formed through the trays all around annular zones thereof, outside the edges of the substrates $S_1$, $S'_1$ and a third substrate (not shown) for the tray $222_1$, substrates $S_2$, $S'_2$ and a third substrate (not shown) for the tray $222_2$, and substrates $S_3$, $S_3'$ and a third substrate (not shown) for tray $222_3$ so as to leave direct passages for fractions of the gas flow admitted into the enclosure, enabling the gas to flow through the planes occupied by the trays in a manner that is equivalent to the gaps $30_1$, $30_2$, $30_3$ shown in FIGS. 1 and 2.

Figure 5:
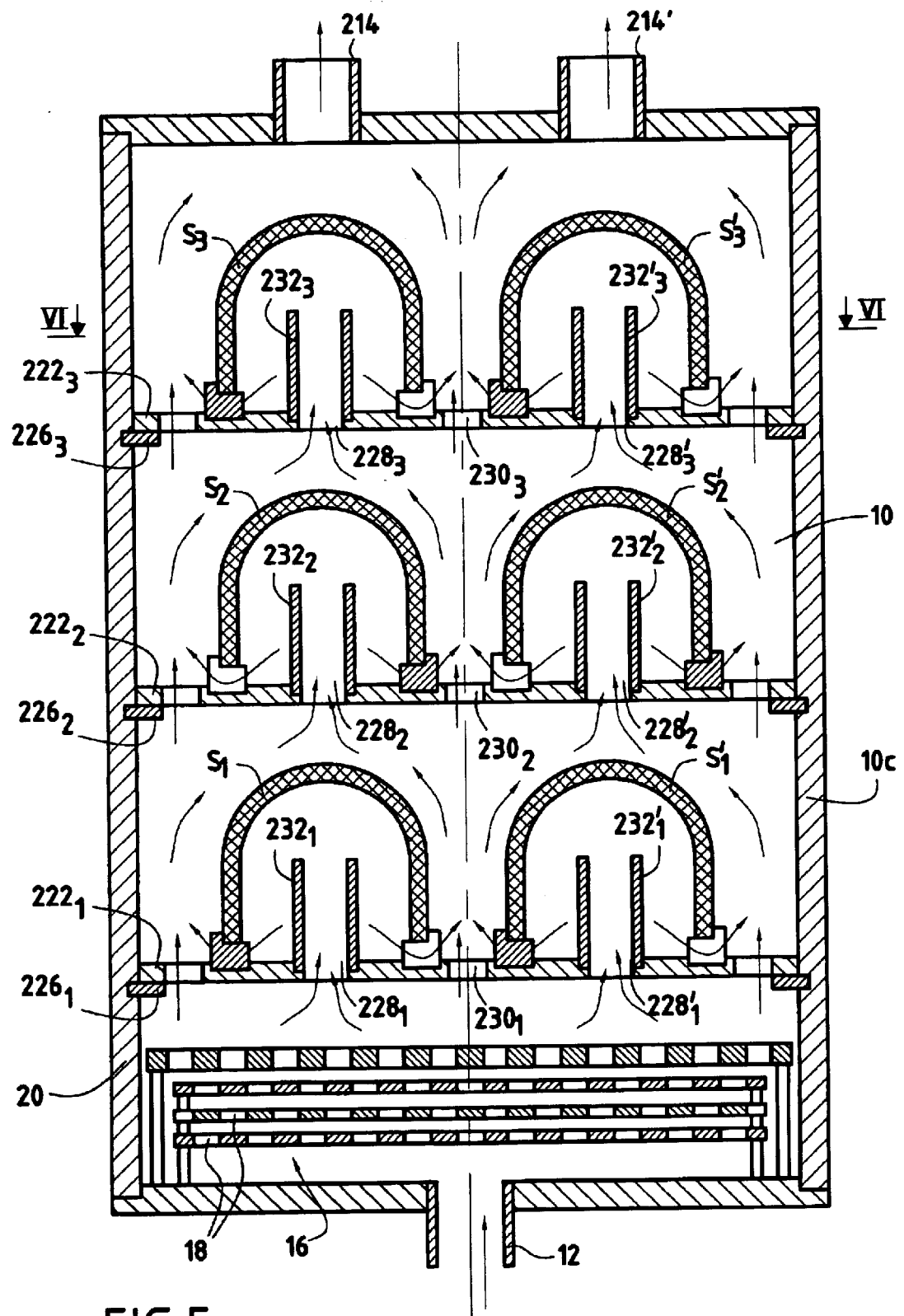
FIG. 5 is a highly diagrammatic fragmentary view in elevation and in section on planes V—V of FIG. 6 showing a chemical vapor infiltration installation constituting a third embodiment of the invention.
Figure 6:
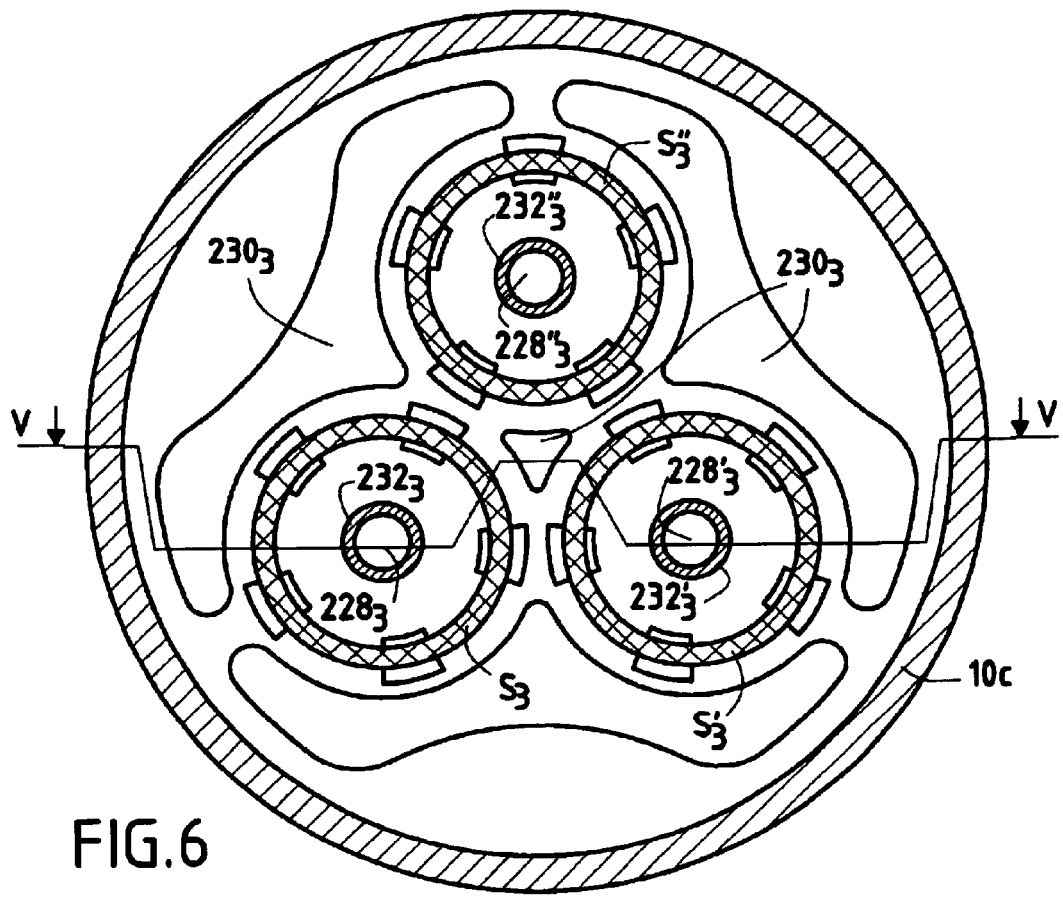
FIG. 6 is a section view on plane VI—VI of FIG. 5 and as seen from above.

FIGS. 5 and 6 show another variant embodiment of the invention. The installation of FIGS. 5 and 6 differs from that of FIGS. 3 and 4 in that the support rays $222_1$, $222_2$, $222_3$ which are supported by shelf-supports $226_1$, $226_2$, $226_3$ carry respective pluralities of substrates, and specifically three substrates such as the substrates $S_3$, $S'_3$, and $S''_3$ for the tray $222_3$.

Each tray, e.g. the tray $222_3$ has a plurality of orifices $228_3$, $228'_3$, and $228''_3$ for directing a fraction of the gas flow towards each inside concave face of the substrates supported by the tray. Guide tooling formed by respective cylindrical guide walls $232_3$, $232'_3$, $232''_3$ are connected to the respective orifices and project into the insides of the volumes defined by the corresponding substrates so as to guide said flow fractions to the vicinities of the end walls of the substrates. Slots $230_3$ are formed in the tray $222_3$ around the locations for the substrates $S_3$, $S'_3$, $S''_3$ so as to allow a fraction of the gas flow admitted into the enclosure to pass directly through the plane of the tray $222_3$ around each of the substrates.

The trays $222_1$ and $222_2$ are made in the same manner as the tray $222_3$, with orifices $228_1$, $228'_1$, $228_2$, $228'_2$ having guide walls $232_1$, $232'_1$ and $232_2$, $232'_2$ connected thereto and having slots $230_1$ and $230_2$.

The dimensions of the orifices and of the slots formed in the support trays are selected so as to ensure that the flow of fresh gas admitted into the enclosure 10 has the desired distribution as it flows towards the faces of the substrates.

A plurality of gas effluent evacuating pipes, such as pipes 214, and 214', are preferably provided and united outside the enclosure, these pipes opening out into the enclosure in register with the tops of the substrates located on the top tray so as to ensure that the gas flow travels fully over the outside faces of these substrates.

In the embodiments described above, the substrates are placed inside the infiltration enclosure with their concave inside faces facing downwards, i.e. directed against the general flow direction of the reactive gas flow inside the enclosure.

Figure 7:
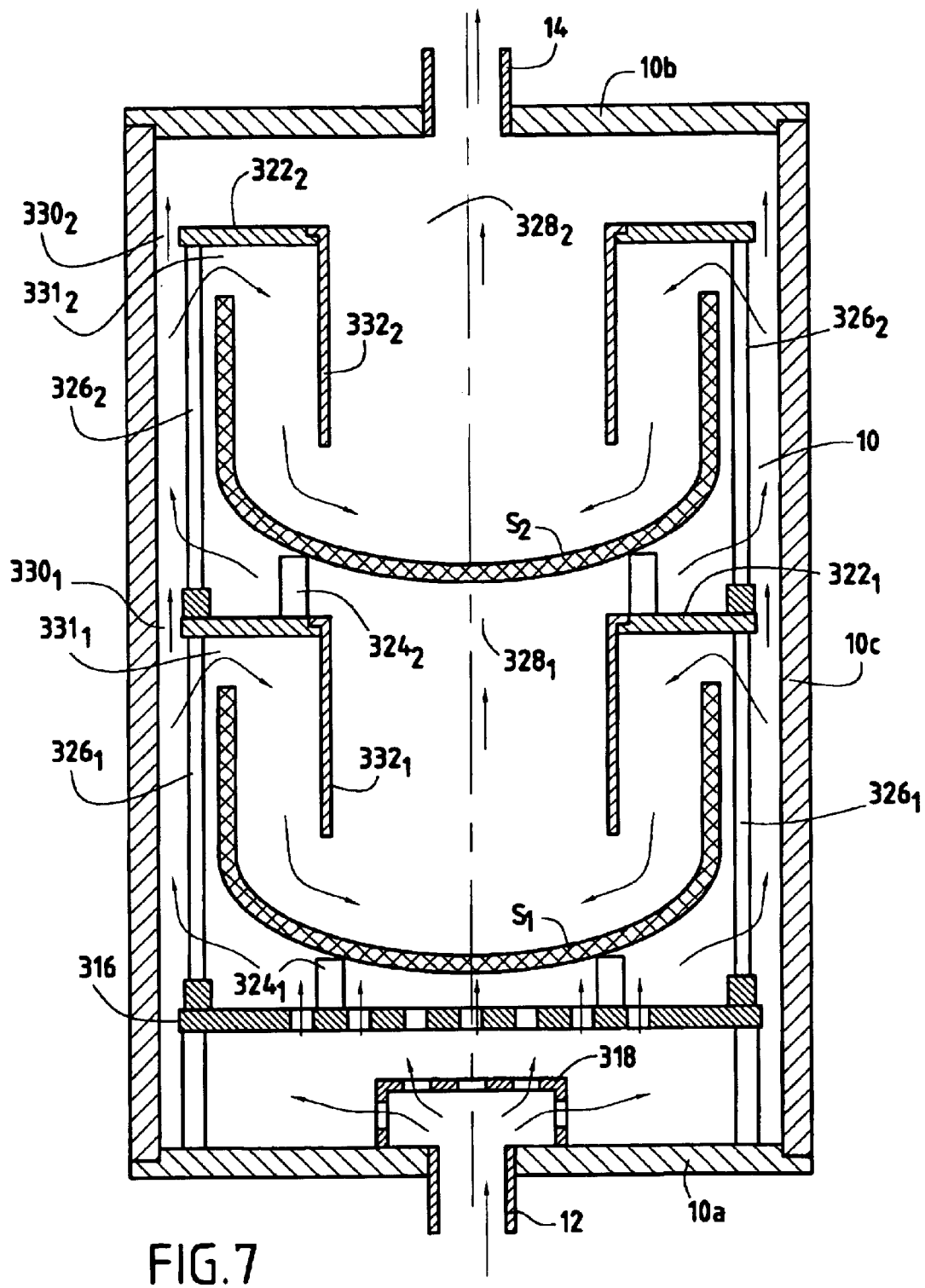
FIG. 7 is a highly diagrammatic fragmentary view in elevation and in section of a chemical vapor infiltration installation constituting a fourth embodiment of the invention.

The substrates could be disposed the other way up, as shown in FIG. 7.

The embodiment of FIG. 7 differs from that of FIG. 1 in particular in that the substrates $S_1$ and $S_2$ are placed inside the enclosure 10 with their concave inside faces directed upwards.

Each substrate $S_1$, $S_2$ has the outside face of its end wall standing on a plurality (at least three) blocks or studs $324_1$, $324_2$. The studs $324_1$ are supported by a tray 316 that performs preheating and diffusion functions on the gas admitted into the enclosure by the pipe 12 which opens, out into the bottom of the enclosure, the gas inlet orifice being surmounted by a flow-distributing cap 318.

The studs $324_2$ are fixed on a respective support tray $322_1$ which stands on the diffusing tray 316 via spacers $326_1$.

The support tray $322_1$ presents a large central opening $328_1$ while also leaving an annular gap $330_1$ at its periphery relative to the side wall $10c$ of the enclosure.

In addition, the tray $322_1$ overlying the substrate $S_1$ leaves an annular gap $331_1$ relative to the top edge of the substrate.

A top tray $322_2$ supported by spacers $326_2$ is placed above the substrate $S_2$ in the same manner as the tray $322_1$ is placed relative to the substrate $S_1$. The tray $322_2$ presents a large central opening $328_2$ and leaves an annular gap $330_2$ relative to the side wall of the enclosure, and an annular gap $331_2$ relative to the top edge of the substrate $S_2$.

The reactive gas flow admitted into the enclosure is distributed through the gaps $330_1$, $330_2$, and $331_2$ so that a fraction of this flow is fed onto each of the faces of the substrates.

The flow fraction passing through the gaps $331_1$ and $331_2$ is guided towards the concave inside faces of the substrates $S_1$ and $S_2$ by means of tooling formed by respective guide walls $332_1$ and $332_2$. The guide walls are, for example, in the form of cylinders or segments of pipe, and they are supported by the trays $322_1$, $322_2$ with their top portions being connected to the edges of the openings $328_1$, $328_2$. Each guide wall penetrates a certain distance into the inside portion of the corresponding substrate so as to bring the flow admitted to the periphery down towards the bottom end wall of the substrate before flowing upwards through the pipe defined by the guide wall (see arrows in FIG. 7).

The residual gas flowing through the opening $328_2$ of the top tray is evacuated by the pipe 14 which opens out in the cover $10b$ of the enclosure.

The guide walls $332_1$, $332_2$ thus force a fraction of the admitted reactive gas flow to sweep over the inside faces of the substrates $S_1$, $S_2$ and to flow along them without leaving any dead volume or without creating any turbulence.

Although the embodiment shown in FIG. 7 shows only two substrate locations, the number of locations could naturally be greater than two, for example by placing more than two substrates one above another or by juxtaposing a plurality of sets of substrates themselves disposed one above another as shown in FIG. 5.

Figure 8:
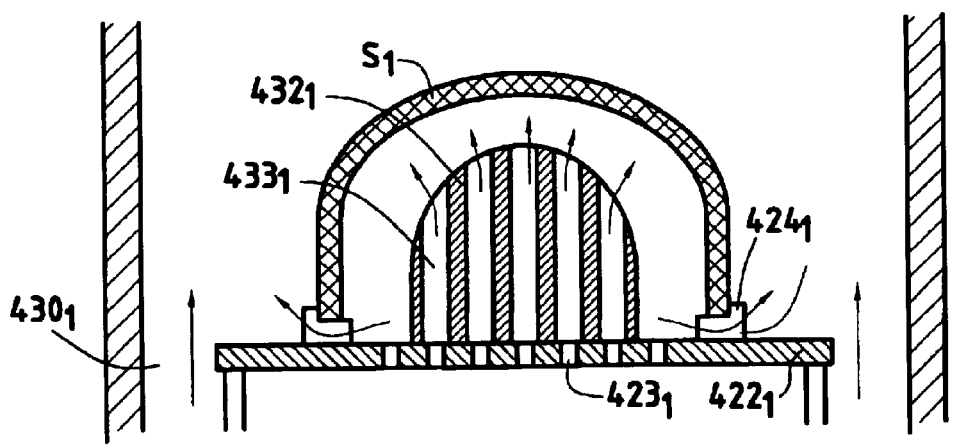
FIG. 8 is a fragmentary section view showing a variant embodiment of tooling for guiding the reactive gas flow towards the concave inside face of a substrate.

In the above description, the tooling for guiding the flow of reactive gas is in the form of walls. Other forms of tooling could be adopted, as shown in FIG. 8.

This figure shows only one substrate $S_1$ supported on a tray $422_1$ by means of studs or blocks $424_1$. The substrate $S_1$ is placed with its concave inside face directed downwards and it rests via its edge on the blocks $424_1$. A stream of gas flows into an annular space $430_1$ around the substrate $S_1$ and through the tray $422_1$ so as to feed the inside face of the substrate $S_1$.

In its portion situated facing the inside face of the substrate $S_1$, the tray $422_1$ presents a plurality of passages or perforations $423_1$ and supports guide tooling $432_1$.

The tooling $432_1$ is in the form of a block, e.g. of graphite, of a shape that is similar and complementary to the shape of the inside volume of the substrate $S_1$ but it is smaller in size so as to leave a gap between the outside face of the block and the inside face of the substrate. The block is pierced by a multitude of passages $433_1$ which bring the gas that passes through the tray $422_1$ to the vicinity of the inside face of the substrate, so that this inside face has the gas flow traveling thereover without leaving any dead volumes.

Although the description above relates to embodiments in which the general flow direction of the gas through the enclosure is upwards, the opposite disposition could be adopted with the general flow direction of the gas being downwards, in which case the preheater zone should be located in the top portion of the enclosure.

Furthermore, the method of the invention can naturally be implemented on substrates of different dimensions received simultaneously within the enclosure.

EXAMPLE

Substrates constituted by bowl preforms were densified using an installation of the kind shown in FIG. 7. The substrates were built up from two-dimensional carbon fiber plies draped onto a shaper and consolidated by being impregnated with a resin followed by polymerization and carbonization of the resin.

The substrates were densified with a matrix of pyrolytic carbon by admitting a gas into the enclosure comprising natural gas or methane as the gaseous precursor for pyrolytic carbon.

The temperature and the pressure inside the enclosure were maintained substantially constant throughout the densification process, at values equal to about 1000° C. and 1.5 kilopascals (kPa).

Once densification had been completed, no projections or soot formations were observed. The inside faces of the resulting C/C composite material bowls were of good appearance, as shown in FIGS. 9 and 10 where FIG. 10 is an image obtained using an optical microscope, with □440 magnification, showing a fraction of the surface of the end wall of a bowl after densification.

Figure 11:
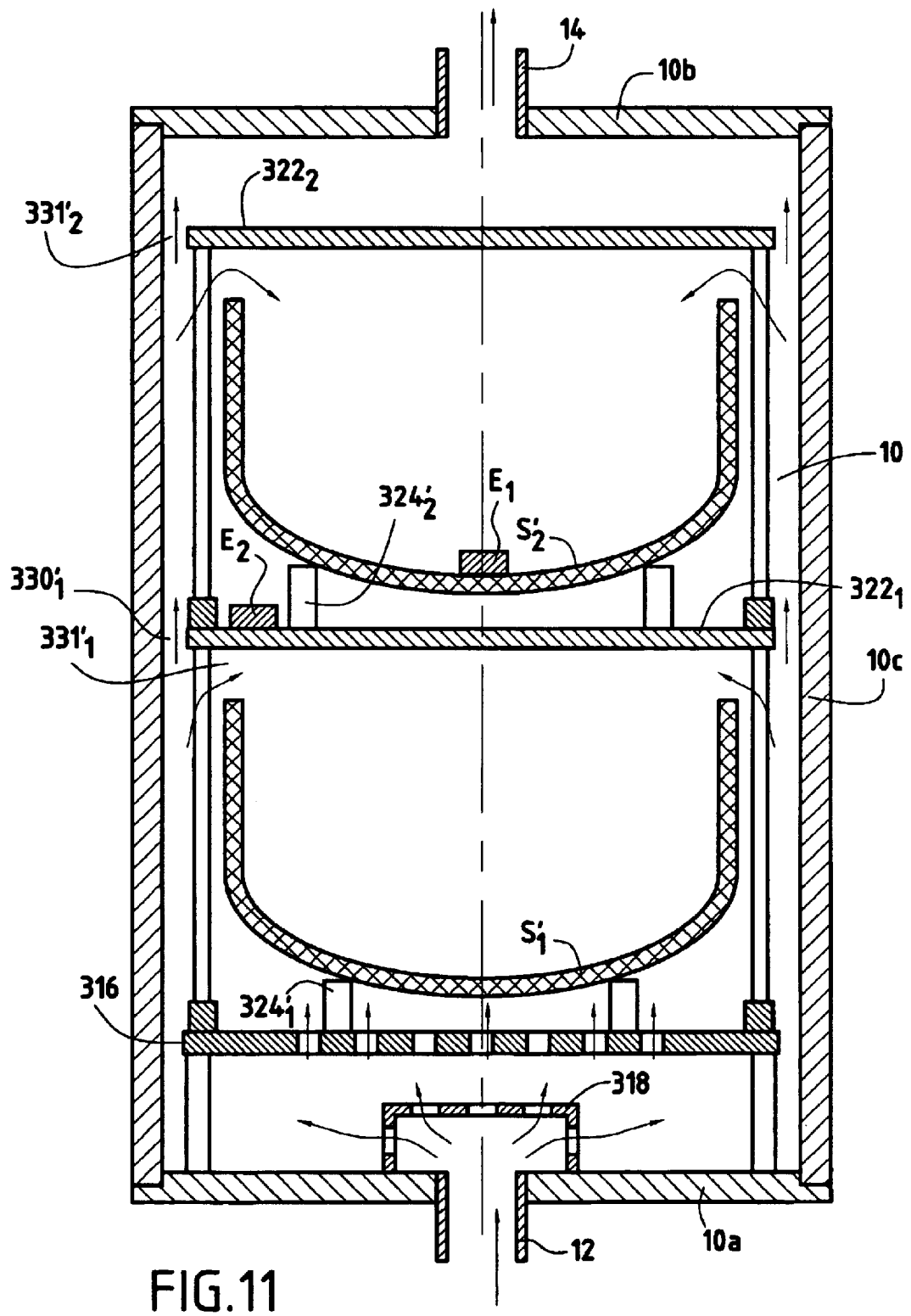
FIG. 11 is a highly diagrammatic view of a chemical vapor infiltration installation of the prior art.

By way of comparison, the same densification process was performed on similar preforms, but omitting the flow-guiding walls $332_1$ and $332_2$ and the central openings $328_1$ and $328_2$ in the trays $322_1$ and $322_2$, as shown in FIG. 11. The substrate $S'_1$ and $S'_2$ were supported by the preheater plate 316 and by a solid tray $332_1$ via blocks $324'_1$, $324'_2$ analogous to the blocks $324_1$, $324_2$ of FIG. 7. Samples $E_1$, $E_2$ made of the same material as the substrates were placed respectively on the end wall of the substrate $S'_2$ and beside it on the tray $322_1$. FIGS. 12 and 13 are images obtained using an optical microscope with □440 magnification, in polarized light showing the surfaces of the samples $E_1$ and $E_2$ after densification. The presence of numerous projections and soot can clearly be seen on the surface of the sample $E_1$, in spite of the improvement provided by the presence of the trays compared with the situation in which substrates are placed without taking any precautions whatsoever on the substrates. Although the trays did not have any central openings and did not support any tooling for guiding the gas flow, they nevertheless helped to distribute gas flow via the gaps $330'_1$, $331'_1$, and $331'_2$.

In comparison, FIGS. 10 and 13 do not show any projections or soot of the kind visible in FIG. 12, confirming that the method of the invention makes it possible to obtain the same quality on the inside surfaces of the end walls of hollow portions of a substrate as can be obtained on substrates that do not present such hollow portions.

What is claimed is:

1. A method of densifying hollow bowl-shaped porous substrates by chemical vapor infiltration, the substrates each having an inside volume defined by a concave inside face and having an opposite convex outside face, the method comprising the steps of:

placing at least one hollow substrate to be densified in an enclosure;

admitting a reactive gas into the enclosure through a gas inlet opening into the enclosure at one end thereof;

causing the gas to flow through the enclosure between said reactive gas inlet and an effluent gas outlet at another end of the enclosure;

dividing at least a portion of the reactive gas flow entering the enclosure into first and second non-zero fractions, wherein the first fraction of the reactive gas flow is fed to the inside face of the at least one substrate and the second fraction of the reactive gas flow is fed to only the outside face of the at least one substrate; and guiding the first fraction of the reactive gas flow feeding the inside face of the at least one substrate by means of a tooling directing the gas into the inside volume of the substrate so that the concave inside face of the substrate is swept in full by the first fraction of the total reactive gas flow admitted into the enclosure.

2. A method according to claim 1, wherein the guidance of a portion of the gas flow is provided by passages formed through a body housed inside the volume defined by the concave inside face of said at least one substrate.

3. A method according to claim 1, wherein the fraction of the total reactive gas flow sweeping over a face of said at least one substrate placed in the enclosure is not less than 5%.

4. A method according to claim 1, wherein the fraction of the total reactive gas flow sweeping over a face of said at least one substrate placed in the enclosure is not less than 10%.

5. A method according to claim 4, characterized in that a plurality of substrates are densified simultaneously, the substrates being placed inside the enclosure in alignment in the general flow direction of the gas through the enclosure.

6. A method according to claim 1, wherein a plurality of substrates are densified simultaneously, the substrates being placed inside the enclosure in alignment in the general flow direction of the gas through the enclosure.

7. A method according to claim 6, wherein the fraction of the total reactive gas flow sweeping over a face of each substrate placed in the enclosure is not less than 5%.

8. A method according to claim 6, wherein the fraction of the total reactive gas flow sweeping over a face of each substrate placed in the enclosure is not less than 10%.

9. A method according to claim 1, wherein said guidance of a portion of the gas flow is provided by a wall portion which penetrates into the volume defined by the concave inside face of said at least one substrate.

10. A method according to claim 9, wherein said portion of the gas flow is guided in part by a cylindrical wall portion to the vicinity of an end wall of the inside volume of said at least one substrate.

11. A method according to claim 10, wherein a plurality of substrates are densified simultaneously, the substrates being placed inside the enclosure in alignment in the general flow direction of the gas through the enclosure.

12. A method according to claim 9, wherein a plurality of substrates are densified simultaneously, the substrates being placed inside the enclosure in alignment in the general flow direction of the gas through the enclosure.

13. A method according to claim 1, wherein:

a plurality of substrates are densified simultaneously, the substrates being placed inside the enclosure in alignment in the general flow direction of the gas through the enclosure;

the fraction of the total reactive gas flow sweeping over a face of each substrate placed in the enclosure is not less than 5%;

the guidance of a portion of the gas flow is provided at least in part by a cylindrical wall portion which penetrates into the volume defined by the concave inside face of the or each substrate, to the vicinity of the end wall of the or each substrate.

14. A method according to claim 1, wherein:

a plurality of substrates are densified simultaneously, the substrates being placed inside the enclosure in alignment in the general flow direction of the gas through the enclosure;

the fraction of the total reactive gas flow sweeping over a face of each substrate placed in the enclosure is not less than 5%;

the guidance of a portion of the gas flow is provided by passages formed through a body housed inside the volume defined by the concave inside face of each substrate.

15. A method of densifying a hollow bowl-shaped porous substrate by chemical vapor infiltration, the substrate having a concave inside face, an opposite convex outside face and an edge defining an opening for accessing an inside volume defined by the concave inside face, the method comprising:

placing the hollow substrate to be densified in an enclosure;

admitting a reactive gas into the enclosure through a gas inlet opening into the enclosure;

causing the gas to flow through the enclosure between said gas inlet and an effluent gas outlet;

directing a first non-zero portion, but not all, of the reactive gas flowing through the enclosure into the inside volume of the substrate by means of a tooling extending into the inside volume of the substrate, wherein the concave inside face of the substrate is swept in full by the first portion of the reactive gas flow; and feeding a second non-zero portion of the reactive gas flowing through the enclosure to the outside face of the substrate.

16. A method according to claim 15, further comprising:

placing at least one other hollow substrate to be densified in the enclosure;

for each of the other hollow substrates, directing a respective first non-zero portion, but not all, of the reactive gas flowing through the enclosure into the inside volume of the other substrate, wherein the concave inside face of the other substrate is swept in full by the respective first fraction of the reactive gas flow; and feeding a respective second non-zero portion of the reactive gas flowing through the enclosure to the outside face of the other substrate.

17. A method according to claim 16, wherein feeding the second non-zero portion of the reactive gas comprises feeding the second non-zero portion of the reactive gas to only the outside face of the substrate.

18. A method according to claim 15, wherein feeding the second non-zero portion of the reactive gas comprise feeding the second non-zero portion of the reactive gas to only the outside face of the substrate.

* * * * *